US008937360B1

(12) United States Patent
Moosman et al.

(10) Patent No.: US 8,937,360 B1
(45) Date of Patent: Jan. 20, 2015

(54) BETA VOLTAIC SEMICONDUCTOR DIODE FABRICATED FROM A RADIOISOTOPE

(71) Applicants: Bryan George Moosman, San Marcos, CA (US); Richard Lee Waters, San Diego, CA (US)

(72) Inventors: Bryan George Moosman, San Marcos, CA (US); Richard Lee Waters, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 112 days.

(21) Appl. No.: 13/852,009

(22) Filed: Mar. 28, 2013

Related U.S. Application Data

(62) Division of application No. 12/949,457, filed on Nov. 18, 2010.

(51) Int. Cl.
*H01L 43/00* (2006.01)
*G21H 1/02* (2006.01)

(52) U.S. Cl.
CPC .......................................... *G21H 1/02* (2013.01)
USPC .................... 257/428; 257/429; 257/E21.465

(58) Field of Classification Search
USPC .................................. 257/428, 429, E21.465
See application file for complete search history.

(56) References Cited

U.S. PATENT DOCUMENTS

| | | | | |
|---|---|---|---|---|
| 5,859,484 | A * | 1/1999 | Mannik et al. | 310/303 |
| 7,301,254 | B1 * | 11/2007 | Lal et al. | 310/309 |
| 2008/0006891 | A1 * | 1/2008 | Gadeken et al. | 257/428 |

* cited by examiner

*Primary Examiner* — Samuel Gebremariam
(74) *Attorney, Agent, or Firm* — SPAWAR Systems Center Pacific; Kyle Eppele; Stephen E. Baldwin

(57) ABSTRACT

In one preferred embodiment, a semiconductor diode includes a first layer formed with a p-type semiconductor, a second layer formed with an n-type semiconductor, and a third active depletion layer contained between the first and second layers. The third layer is formed with a radioisotope of the p-type and n-type semiconductors (preferably Si 32) such that initial emission of beta particles begins in the active depletion region and substantially all of the emitted beta particles are contained within the first, second and third layers during operation. The p-type and n-type layers each have sufficient depth to contain substantially all of beta particles emitted from the depletion layer. The depth of each of the p-type and n-type layers is substantially equal to or greater than the maximum beta emission depth of the radioisotope.

6 Claims, 9 Drawing Sheets

80

70

7A

7B

7C

BETA VOLTAIC SEMICONDUCTOR DIODE FABRICATED FROM A RADIOISOTOPE

FEDERALLY-SPONSORED RESEARCH AND DEVELOPMENT

This invention (Navy Case No. 102,478) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

BACKGROUND

The present invention relates to a semiconductor diode, and more particularly to a beta voltaic semiconductor diode fabricated from a radioisotope. Beta voltaics convert the energy of radioactive decay products directly into electrical power. They operate much the same way as a solar cell except that the beta particles (high energy electrons) are used, rather than photons. The beta particles can produce many electron-hole pairs in the diode per incident particle. The accepted method of construction is to coat a diode with a beta emitter (i.e. a radioisotope that undergoes beta decay) such as Nickel 63, tritium (usually as a metal hydride), or promethium 147. Radiation damage is often an issue, therefore silicon carbide, (being more radiation hard than silicon) is primarily used. The high energy electrons (beta particles) do not penetrate very far into silicon. This presents issues for fabrication of the diodes and favors high surface to volume geometries (i.e., pillar or comb structures are employed).

SUMMARY

In one preferred embodiment, a semiconductor diode includes a first layer formed with a p-type semiconductor, a second layer formed with an n-type semiconductor, and a third active depletion layer contained between the first and second layers. The third layer is formed with a radioisotope of the p-type and n-type semiconductors (preferably Si 32) such that initial emission of beta particles begins in the active depletion region and substantially all of the emitted beta particles are contained within the first, second and third layers during operation. The p-type and n-type layers each have sufficient depth to contain substantially all of beta particles emitted from the depletion layer. The depth of each of the p-type and n-type layers is substantially equal to or greater than the maximum beta emission depth of the radioisotope. Incorporation of the isotope as the diode material overcomes the short range of the beta particles and simplifies the device fabrication geometry.

BRIEF DESCRIPTION OF THE DRAWINGS

Throughout the several views, like elements are referenced using like reference numerals, wherein.

DETAILED DESCRIPTION OF THE EMBODIMENTS

Figure 1:
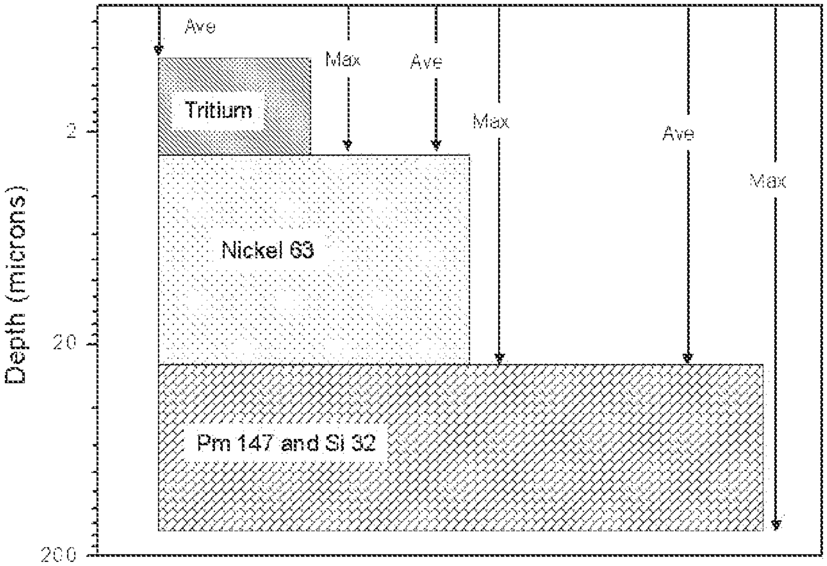
FIG. 1 is a graph showing the range of high energy electrons in silicon carbide for three isotopes.

The present invention relates to a semiconductor diode, and more particularly to a beta voltaic semiconductor diode fabricated from a radioisotope. Beta voltaics are generators of electrical current, in effect a form of a battery, which use energy from a radioactive source emitting beta particles (high energy electrons). Beta voltaics are particularly well-suited to low-power electrical applications where long life of the energy source is needed, such as implantable medical devices or military or space applications. Beta voltaics convert the energy of radioactive decay products directly into electrical power.

In electronics, a diode is a two-terminal electronic component that conducts electric current in only one direction. A semiconductor diode is fabricated from a crystal of semiconductor such as silicon that has impurities added to it to create a region on one side of a junction that contains negative charge carriers (electrons), called n-type semiconductor, and a region on the other side of that junction that contains positive charge carriers (holes), called p-type semiconductor. The diode's terminals are attached to each of these regions, and the boundary within the diode between these two regions is called a PN junction, in which the action or operation of the diode takes place.

There are many types of junction diodes, which either emphasize a different physical aspect of a diode often by geometric scaling, doping level, choosing the right electrodes, or just in the application of a diode in a special circuit. For example, a Schottky diode is typically fabricated from the contact between a metal and a semiconductor, rather than by a PN junction. A Schottky diode has a potential barrier formed at the metal-semiconductor junction which has rectifying characteristics, suitable for use as a semiconductor diode.

Accordingly, the term "semiconductor diode" as used and claimed herein is intended to cover many types of semiconductor diodes, as will become apparent from the following description, when taken in conjunction with the accompanying drawings.

In one preferred embodiment, the present invention relates to a beta voltaic or 'nuclear battery" using an isotope of silicon (Si32) as the source (beta emitter), where the diode itself is made from the isotope. The present invention provides a long term power source for remote power generation of high efficiency and long term operation.

In one embodiment, the present invention would make the diode out of an isotope of silicon (silicon-32 or Si32). The diode could be either silicon or silicon carbide. Silicon-32 is a pure beta emitter with no gamma radiation. It has a long half life of about 150 years and decays to phosphorus 32 (another strong beta emitter). Since the silicon-32 is internal to the diode structure, the short range of the beta particles is overcome and a simple planer geometry can be used. The use of silicon-32 vs. the naturally occurring (stable) isotopes of silicon should cause no material difference in the operation of the diode beyond the effects of radioactive decay.

In a preferred embodiment, one aspect is to use a radioisotope (beta emitter) within the diode itself rather than applying it to the surface. The energy can be more efficiently harvested since the beta particles are emitted in the active region of the diode. Silicon-32 is one preferred candidate. Silicon-32 is a pure beta emitter, with no gamma rays. Silicon and silicon carbide diodes are made with silicon, therefore no "impurities" need to be added to the diode. Silicon has a 150 year half-life, ensuring commensurate long power output.

The simple planer geometry with silicon-32 inside the device would be relatively straightforward to make, by using silicon-32 during manufacturing. The intended uses of such devices are for long missions, using low average power, where it would be difficult to change a traditional battery (such as deep sea, space probes, medical implant, remote location data collection etc.).

FIG. 1 is a graph showing the range of high energy electrons in silicon carbide. Note the vertical axis (Y-axis) is shown on a log scale in FIG. 1 for clarity.

For each isotope, the electrons are emitted at different energies. In FIG. 1, the average range is for the average-energy electron, the maximum range is the distance traveled for the maximum energy electron. The isotopes $Pm^{147}$ and $Si^{32}$ have equivalent emitted electron energies and therefore equivalent ranges. These ranges were calculated using data from NIST (National Institute of Standards and Technology), using the continuously slowing down approximation, which includes collisions and bremsstrahlung radiation (which can defined as electromagnetic radiation produced by the acceleration of a charged particle, such as an electron, when deflected by another charged particle, such as an atomic nucleus).

Note that beta particle from tritium does not penetrate far into the silicon carbide. Also note the average and maximum ranges in depth shown in silicon carbide shown in FIG. 1 for Tritium, Nickel 63, and Pm 147/Si 32. In particular, the average-energy electron travel depths for Pm 147 and Si 32 shown in FIG. 1 are more than 20 microns (on the log scale) and the maximum-energy electron travel depth for Pm 147 and Si 32 shown in FIG. 1 (again on the log scale) are less than 200 microns in depth.

Figure 2:
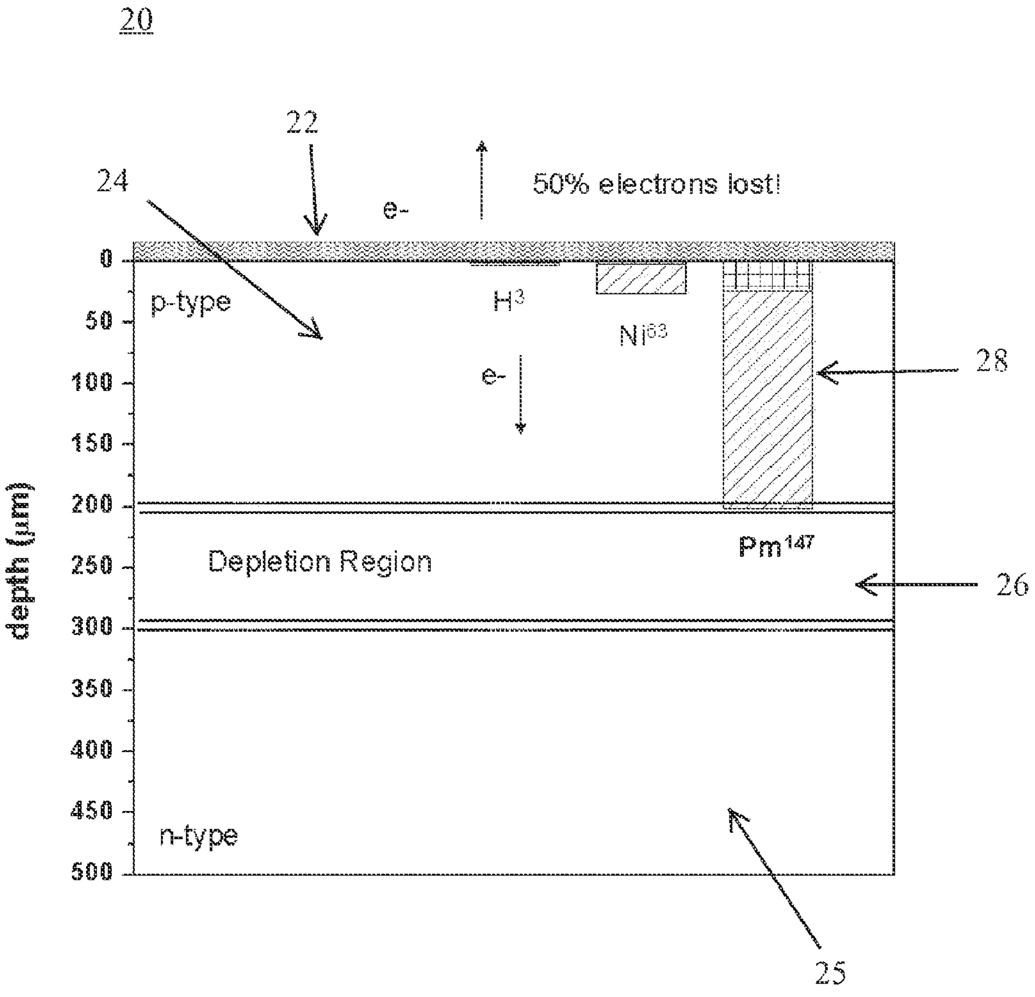
FIG. 2 is a graph showing a diode with various isotopes coated on the surface.

FIG. 2 is a graph illustrating the general problems described above. FIG. 2 shows a diode 20 with various isotopes coated on the surface 22 (the top layer 22 in the graph of FIG. 2). The diode 20 in FIG. 2 includes a layer of a p-type region 24, a layer of an n-type region 25, and a depletion region 26. The depth (or width) of the p-type layer 24 and n-type layer 25 are each approximately 200 microns, or more than the maximum energy electron levels for Pm 147 and Si 32 shown in FIG. 1.

In FIG. 2, the range of an average energy electron from each isotope is shown as the square hash pattern (not quite visible for tritium (H3) or nickel 63)—see the previous FIG. 1 for reference. The range of maximum penetration depth is shown in FIG. 2 as a diagonal hash mark 28. Note that for the geometry shown in FIG. 2, only promethium 147 penetrates into the depletion region 26 or the active layer of the diode. Also note that roughly half of the emitted electrons are not captured by this geometry shown in FIG. 2.

Figure 3:
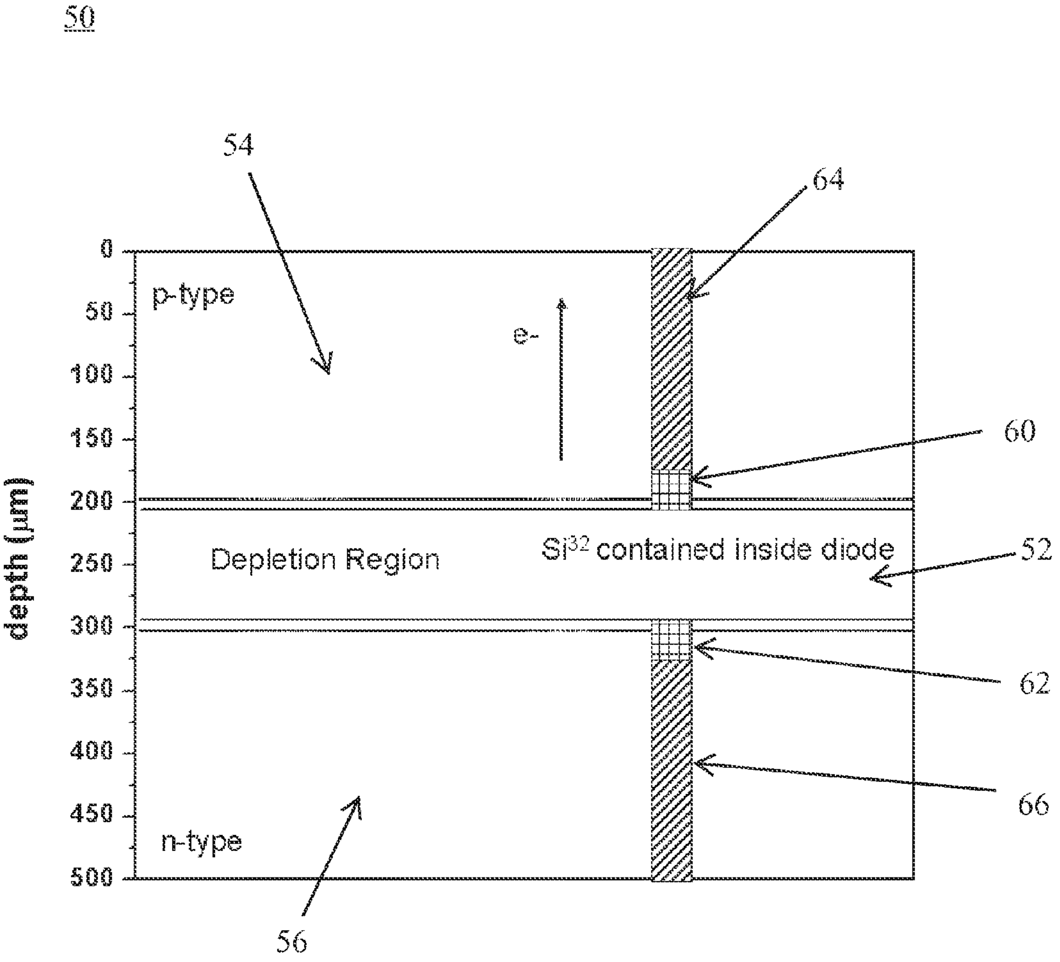
FIG. 3 shows a view of a diode of the present invention with the depletion region made from Si32 where the average and maximum ranges are shown as cross hatching.

FIG. 3 shows a view of a diode 50 of the present invention with the depletion region 52 made from silicon-32 (a radioisotope of silicon). In this geometry shown in FIG. 3, the layer 54 of the p-type region and the layer 56 of the n-type region act to slow the emitted electrons down. The square hatch regions 60, 62 are the respective stopping ranges for the average energy beta emitted by silicon-32, and the diagonal hatches 64, 66 show the range of the maximum energy beta emitted by silicon-32 from depletion region (or layer) 52. Note how the electrons emitted by silicon-32 are now mostly contained within the diode 50 shown in FIG. 3.

One advantage of the present invention is that all the emitted electrons start in the active depletion region shown in FIG. 3. This means that most of the emitted electrons can be converted to electrical energy. In a standard geometry (isotope coated on a surface), half of the electrons are lost (emitted away from the diode), as seen in FIG. 2. Many more electrons do not make it into the active region. This eliminates the need to optimize the surface to volume ratio, as would be required for the structure shown in FIG. 2. Note in FIG. 3, the emitted electrons are now contained within the diode without extra shielding.

For illustrative purposes, the depths (in microns) for the diode device shown in FIG. 3 are as follows: the p-type region (or layer) is approximately 200 microns in depth (again, more than the maximum energy electron level for Si 32 shown in FIG. 1); the n-type region (or layer) is also approximately 200 microns in depth (also more than the maximum energy electron level for Si 32 shown in FIG. 1); and the depletion region is approximately 100 microns in depth, as shown in FIG. 3.

Figure 4:
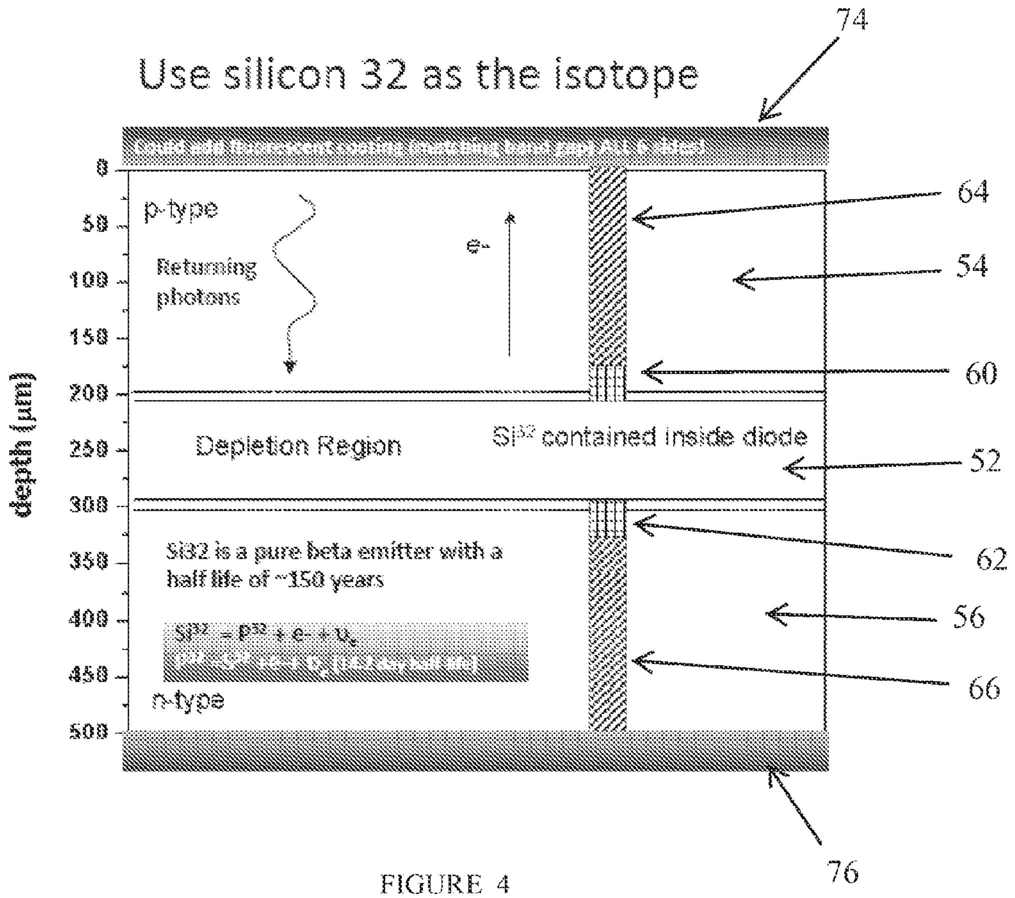
FIG. 4 shows another view of a diode embodiment based on FIG. 3.

FIG. 4 shows another embodiment 70 of the present invention in which an energy converter on the surface of the diode that converts the high energy electrons into photons and with a mirror surface, sends them back into the diode 70 to get converted to electricity as well. A fluorescent coating 74, 76 can be added to all the sides of the diode 70, so that photons are returned into the diode structure 70, as shown in FIG. 4. The Si32 contained inside the diode 70 is a pure beta emitter with a half life of ~150 years. It is also known that $Si^{32}=P^{32}+e-+v_e$ and that $P^{32}=S^{32}+e-+v_e$ (14.2 day half-life).

Figure 5:
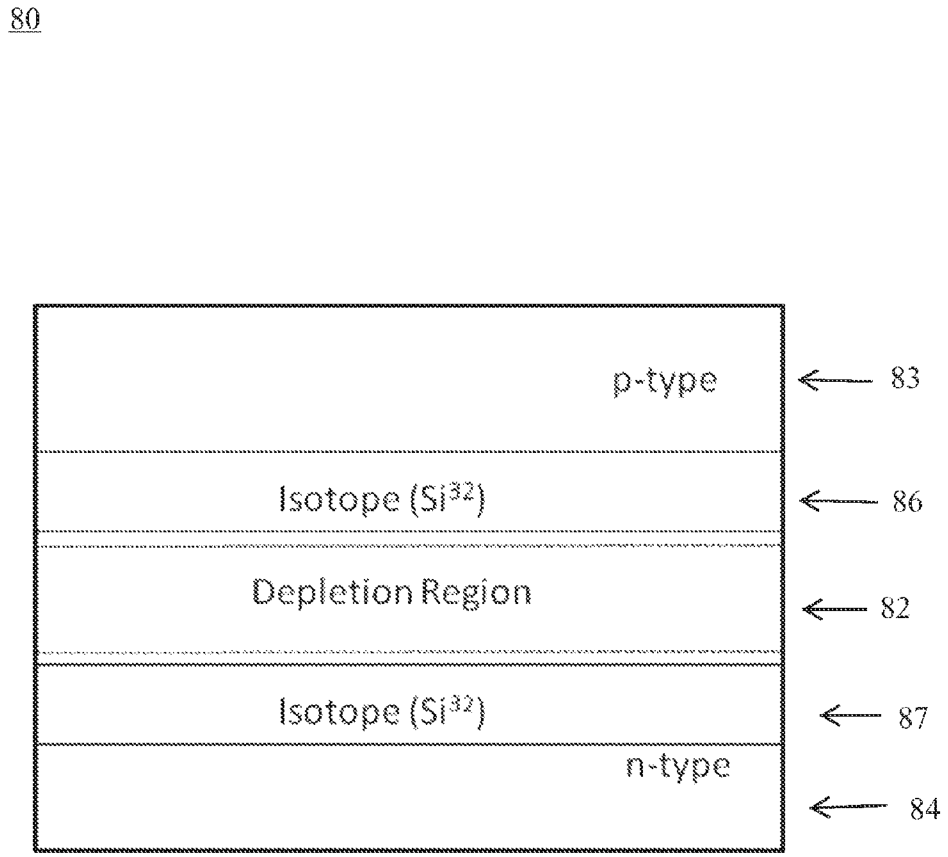
FIG. 5 shows another embodiment of a semiconductor diode of the present invention.

FIG. 5 shows another embodiment of the present invention where the radioisotope is placed outside the depletion region. The semiconductor diode 80 shown in FIG. 2 includes a depletion region 82, a p-type layer 83, and an n-type layer 84. The depletion region 82 is critical for the functioning of the diode/betavoltaic cell. As shown in FIG. 5, one could place the isotope layers 86, 87 only outside the critical region 82, which could increase the operational life of the device. The resulting dimensions would be open to optimization.

In the embodiment shown in FIG. 5, two isotope layers 86, 87 are placed above and below the depletion region 82. However, one isotope layer could be configured with the present invention (at least one isotope layer would be utilized in such an embodiment).

Figure 6:
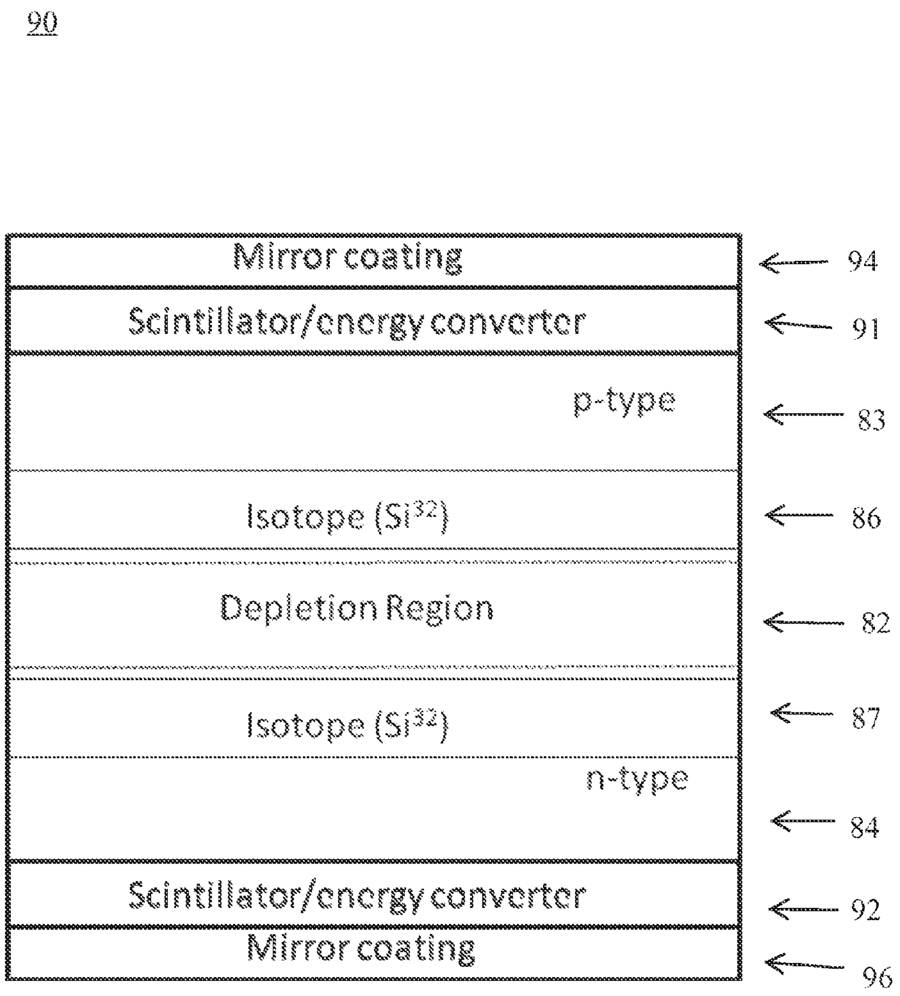
FIG. 6 shows a variation of the embodiment shown in FIG. 5.

FIG. 6 shows still another embodiment of a semiconductor diode 90 of the present invention, as a further variation of FIG. 5. The semiconductor diode 90 of FIG. 2 further includes scintillator/energy converter layers 91, 92, together with mirror coating layers 94, 96.

In FIG. 6, the scintillator layers 91, 92 could be made from quantum dots, which have a high conversion efficiency. Any scintillator layer that converts the beta particles to light, matched to the band-gap of the diode (such as blue light for silicon carbide) would be suitable. The scintillator layers 91, 92 shown in FIG. 6 converts escaping high energy beta particles (electrons) into light, which is directed back into the depletion region 82, where it can be converted to an electron-hole pair and give rise to an electric current. A mirror surface layers 94, 96 (dielectric mirror tuned to the wavelength of the light emitted by the scintillator) shown in FIG. 6 reflects the light back into the depletion region 82. The scintillator, mirror, and p-type region act as radiation shielding as well.

The entire device of the present invention could be made using a radioisotope such as silicon-32. Extra shielding for the electrons would be necessary. If a suitable isotope was available, the dopants added to make n or p-type could be radioisotopes. The surface could still be coated with an isotope. If the surface was coated with Pm 147, the device would have high power initially and decay with the 2.62 year half life of Pm 147, then remain powered at a low level for the half-life of silicon-32 (~150 years).

In general, the percent of silicon-32 relative to the stable isotope (silicon-28) could be tailored throughout the diode. The use of silicon-32 in $p^{+}n$, junctions and Schottky diodes, etc would also be useful. Any diode junction used for generating electric power (photovoltaic) that contains silicon could be made with silicon-32. Note that the main dimensions shown in the figures above are somewhat arbitrary, and are not necessarily shown to scale.

It should be understood that silicon-32 could be used as the power source and this would avoid the shallow range of the beta particles in the diode. This eliminates a surface to volume issue during design and manufacturing of such devices. Silicon-32 can be used in just the depletion region and the surrounding layers can then be used to contain the beta particles.

Figure 7:
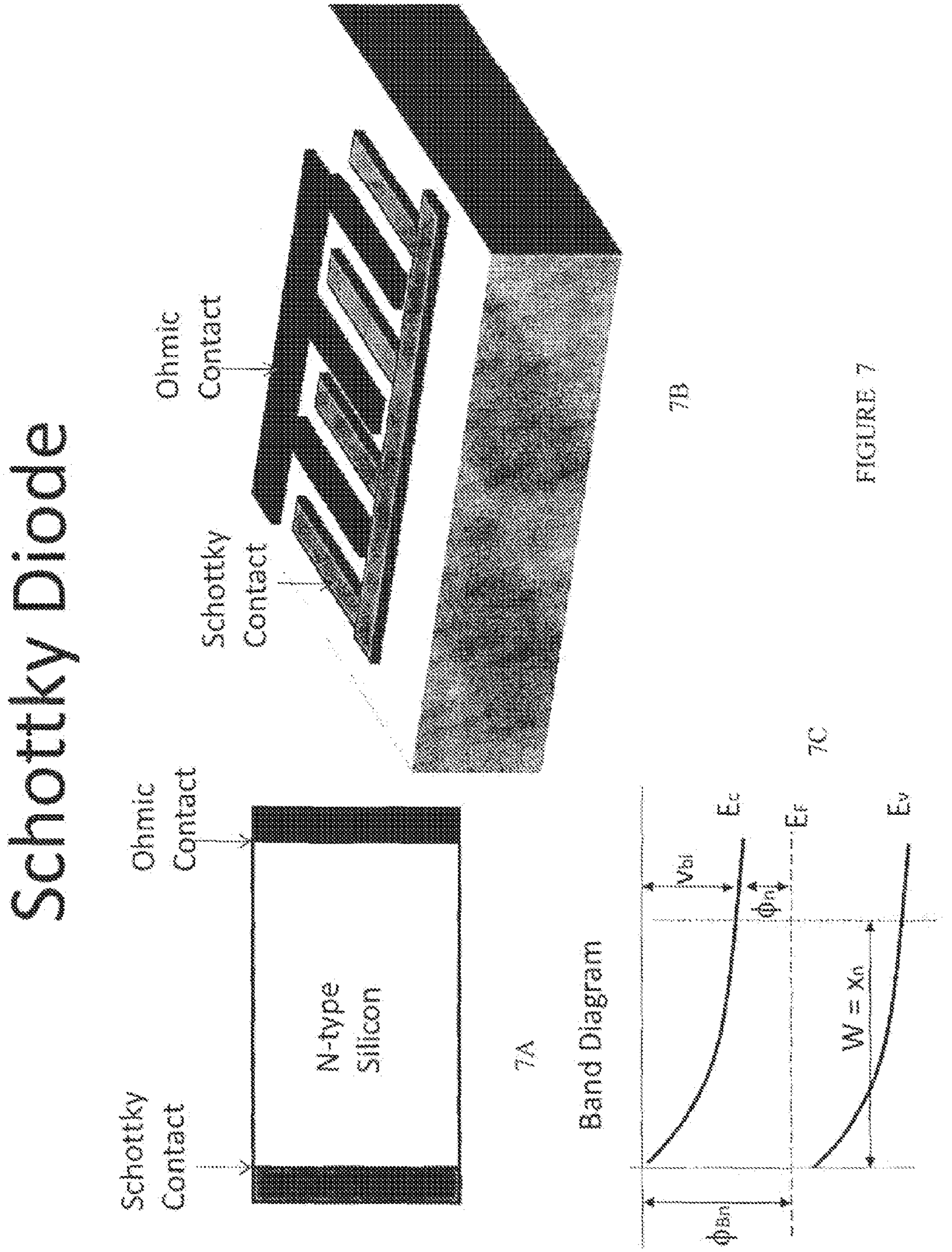
FIG. 7 shows views of a Schottky diode.

FIG. 7 shows several views of a Schottky diode, which is a well known configuration, and with which the features of the present invention can be incorporated. FIG. 7A shows a side view of a Schottky diode, with an N-type silicon between a Schottky contact and ohmic contact. FIG. 7B shows a perspective view of a Schottky contact and an ohmic contact on a substrate. FIG. 7C shows a band diagram of a Schottky diode.

Figure 8:
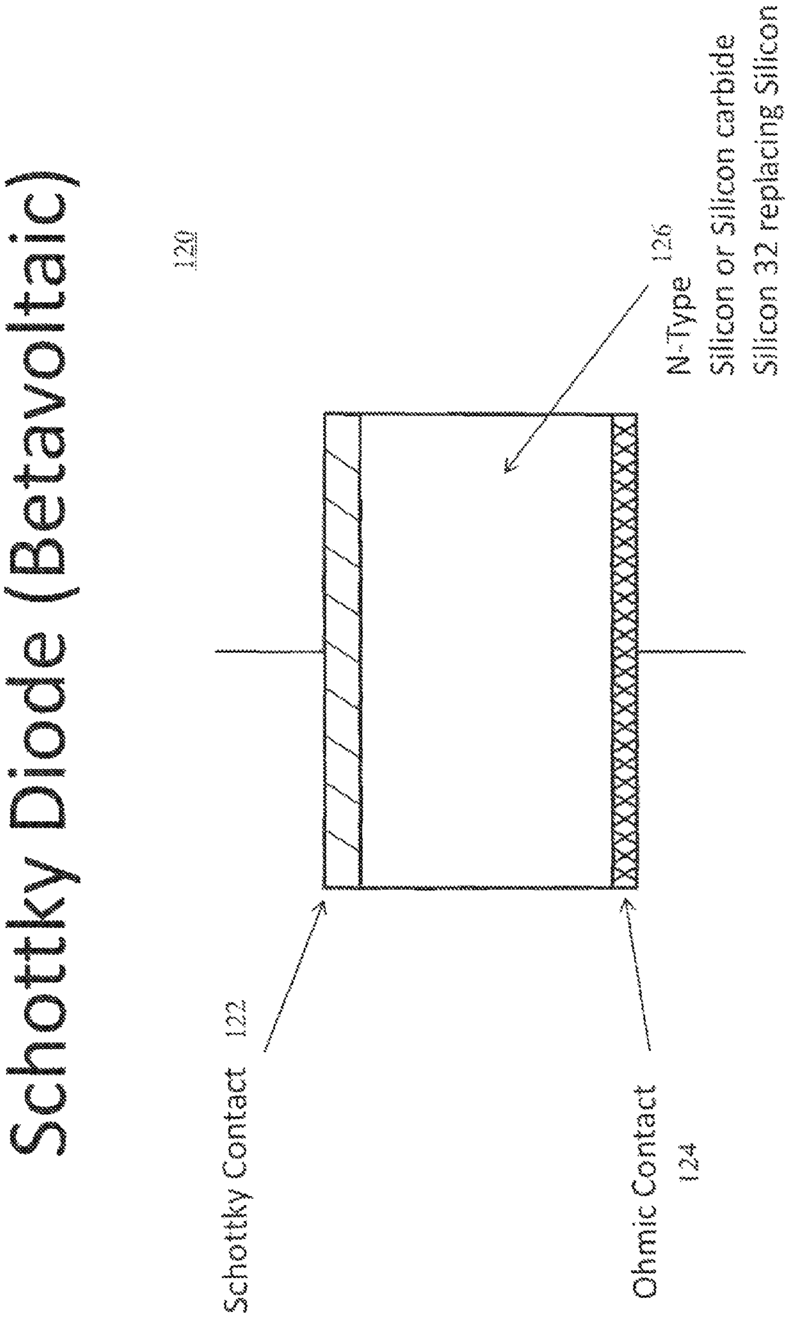
FIG. 8 shows a view of a beta voltaic Schottky diode.

FIG. 8 shows a beta voltaic Schottky diode 120 of the present invention, with radioisotope 126 (silicon 32) between Schottky contact 122 and ohmic contact 124.

Figure 9:
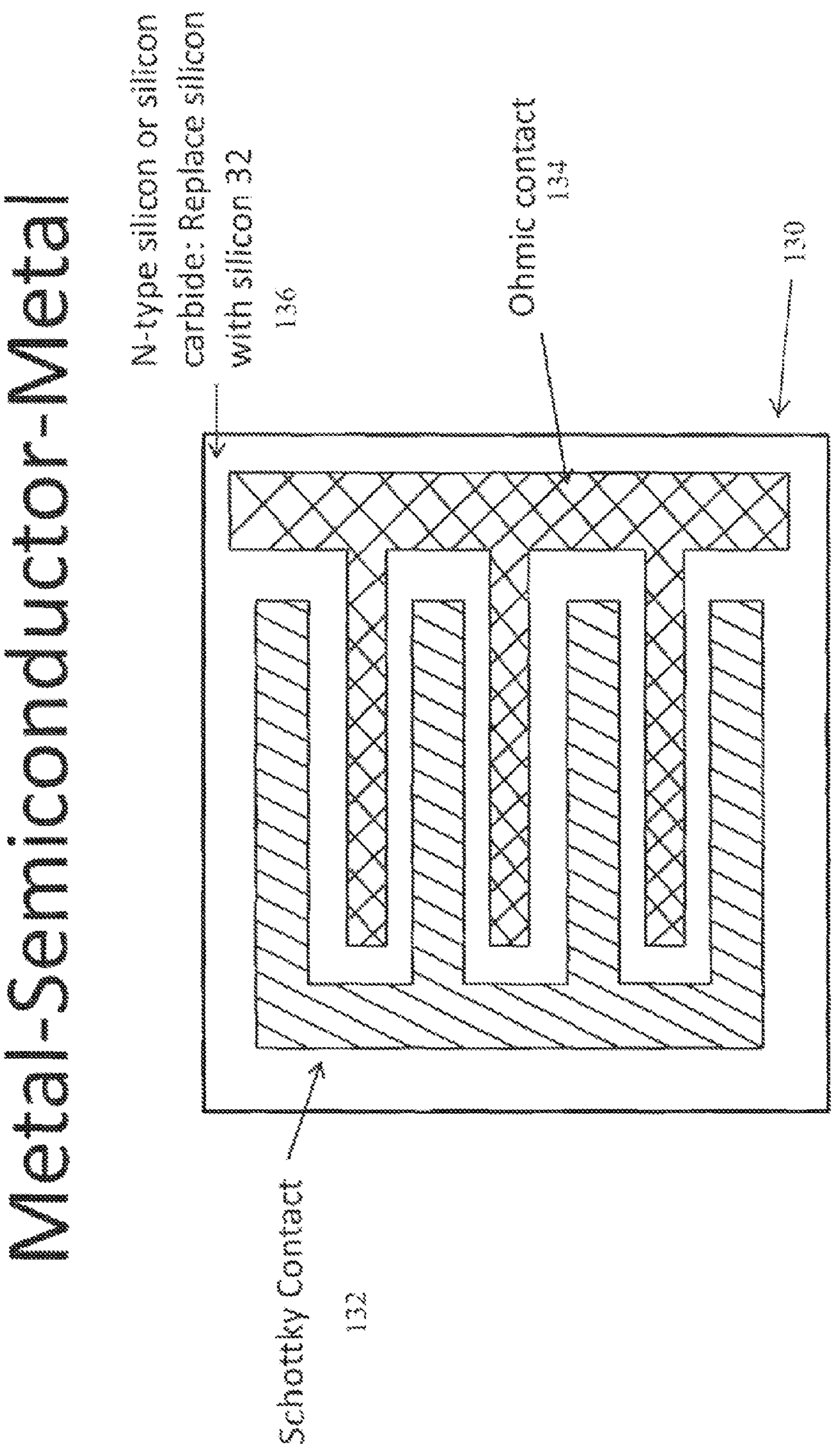
FIG. 9 a top view of a beta voltaic Schottky diode.

FIG. 9 shows a top view a metal-semiconductor-metal configuration 130 of radioisotope 136 between Schottky contact 132 and ohmic contact 134.

In FIGS. 8 and 9, the energy of the beta particles would excite electrons in the semiconductor (N-type) into the conduction band, where they pass through the electric circuit, generating power. The depth should presumably be contained within the region defined as the depletion region, W, as shown in the energy band diagram of FIG. 7C. The contact is a Schottky contact if there exists an energy barrier (i.e. Schottky barrier) when the metal is deposited onto the semiconductor. Creating a Schottky barrier is actually much easier than creating an Ohmic contact. With an Ohmic contact the energy level of the metal is chosen to line up precisely with the conduction band or valence band energy levels for n-type and p-type semiconductors respectively. The Schottky contact creates a built-in depletion region just like the diode so they operate in a very similar fashion from that standpoint.

From the above description, it is apparent that various techniques may be used for implementing the concepts of the present invention without departing from its scope. The described embodiments are to be considered in all respects as illustrative and not restrictive. The present invention is suitable for use with many types of semiconductor diodes, such as illustrated, for example, in "Diode-Wikipedia, the free encyclopedia", which is readily accessible via the Internet at http://en.wikipedia.org/wiki/Diode, which shows many types of semiconductor diodes which could be utilized with the present invention. Also see S. M. Sze in "Physics of Semiconductor Devices", Wiley 2007. It should also be understood that system is not limited to the particular embodiments described herein, but is capable of many embodiments without departing from the scope of the claims.

What is claimed is:

1. A semiconductor diode comprising:

a first layer formed with a p-type semiconductor;

a second layer formed with an n-type semiconductor;

a third active depletion layer contained between the first and second regions, the third layer formed with a p-n type semiconductor;

a fourth layer and a fifth layer each formed with a radioisotope between the first and third layers and the second and third layers, respectively, such that initial emission of beta particles begins in the fourth and fifth layers and substantially all of the emitted beta particles are contained within the first through fifth layers during operation.

2. The diode of claim 1 where the p-type and n-type layers have sufficient depth to contain substantially all of beta particles emitted from the fourth and fifth layers.

3. The diode of claim 2 where the depth of the p-type and n-type layers is substantially equal to or greater than the maximum beta emission depth of the radioisotope.

4. The diode of claim 3 including a scintillator layer formed on the p-type and n-type layers, respectively, for converting beta particles into light and reflecting the light back to the depletion layer.

5. The diode of claim 4 including a mirror coating formed on the respective scintillator layer for reflecting light back to the depletion layer.

6. A Schottky-type semiconductor diode comprising:

a first Schottky contact layer;

a second ohmic contact layer;

a third active depletion layer contained between the first and second layers, the third layer formed with a radioisotope of p-type or n-type semiconductors such that initial emission of beta particles begins in the active depletion region and substantially all of the emitted beta particles are contained within the first, second and third layers during operation.

* * * * *